Oct. 1, 1968 P. FIGIELSKI 3,404,286
SIGNAL RESPONSIVE APPARATUS
Filed Aug. 18, 1965
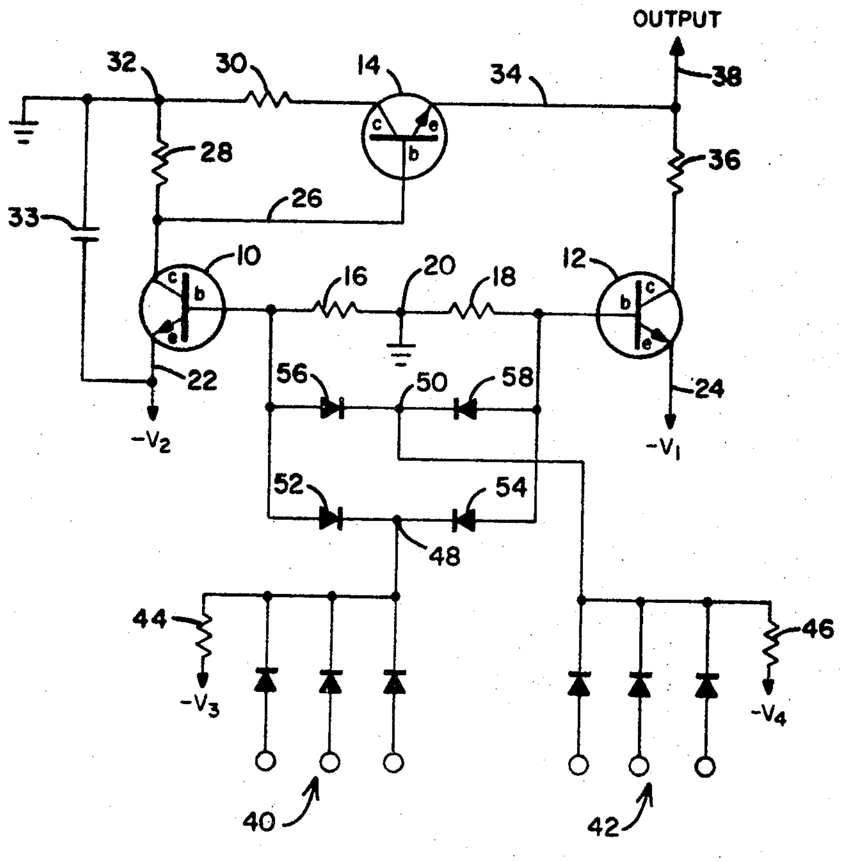
INVENTOR
PETER FIGIELSKI
BY Thomas J. Nikolai
ATTORNEY United States Patent Office 3,404,286

Patented Oct. 1, 1968

3,404,286

SIGNAL RESPONSIVE APPARATUS

Peter Figielski, Minneapolis, Minn., assignor to Sperry Rand Corporation, New York, N.Y., a corporation of Delaware Filed Aug. 18, 1965, Ser. No. 480,711

3 Claims. (Cl. 307—218)

ABSTRACT OF THE DISCLOSURE

A high fan-out driver circuit capable of driving a relatively large number of similar logic circuits while mantaining a rapid switching time is described. First and second transistors are connected in a balanced configuration to a suitable diode logic input circuit. Resistors in the base circuit assist in providing a balanced circuit operation. The balanced transistors are coupled to an amplifier output transistor. When the input conditions to the diode logic are such that the amplifier stage is rendered conductive, a relatively large current is available for supplying charging currents to the capacity loads which may be present between the output of the amplifier circuit and the inputs to the logic circuits being driven. When the input conditions are such that the amplifier stage is non-conducting, one of the balanced pair of transistor circuits is heavily conductive and provides essentially a short circuit path for the discharge of the capacitive loads.

This invention relates generally to a logic circuit suitable for use in digital data processing devices and more specifically to an improved logic circuit which is especially adapted to provide output signals to a large number of other digital logic circuits.

In the prior art there are described various types of circuits capable of performing Boolean logical propositions. As is well known in the art, these relatively simple logic networks may be combined to form more complex networks which will perform digital computing functions such as addition, subtraction, etc. It is obvious that when these logical building blocks are to be cascaded, the circuit comprising the building block must be capable of driving more than one similar logic circuit. Not all of these prior art circuits have proved to be suitable when the "fan-out" requirements are high. More specifically, when it is desired to drive, for example, five or more logic circuits from the output of a first logic circuit, capacitive loading has seriously affected the switching time of the first logic circuit.

The present invention provides a novel driver circuit for performing digital logic wherein the problems created by capacitive loading are to a great extent minimized. First and second transistor inverters are connected in a balanced configuration to a suitable diode logic input circuit. The two balanced transistors are, in turn, connected to an output terminal by way of an emitter-follower transistor stage. When the input conditions are such that the emitter follower stage is rendered conductive, a relatively large current is available for supplying charging current to any capacity type loads which may be present between the output of the driving circuit and the inputs to following logic circuits. On the other hand, when the input conditions are such that the emitter follower stage is non-conducting, one of the transistors in the pair of balanced transistors is heavily conducting and provides a short circuit path for the discharge of said capacitive loads. Because of the novel circuit design of the present invention, it is possible to drive 12 identical circuits while still maintaining the rise and fall time for the output signal in the neighborhood of 7 nanoseconds.

Accordingly, it is object of the present invention to provide an improved transistor logic circuit capable of providing logical input signals to a plurality of other networks while still maintaining extremely good waveform characteristics.

This and other more detailed and specific objects will be disclosed in the course of the following specification, reference being had to the accompanying drawing in which a schematic diagram of a preferred embodiment of the present invention is shown.

Referring to the drawing, there are shown three NPN transistors 10, 12, and 14 each having an emitter electrode *e*, a collector electrode *c*, and a base electrode *b*. It should be understood that PNP transistors may also be utilized, provided proper polarity conventions are observed. The base electrodes **10*b* and 12*b* are connected by means of resistors 16 and 18 to a junction point 20 which is tied to a point of fixed potential, here shown as ground. These two resistors are selected to compensate for any differences between the base to emitter voltage characteristics of the transistors 10 and 12 to thereby prevent current hogging by one of the transistors. The electrodes 10*e* and 12*e* are connected by conductors 22 and 24** to the negative terminal of a suitable power supply (not shown).

The base electrode **14*b* is connected by means of conductor 26 to the collector electrode 10*c*. A pair of resistors 28 and 30 each have a first terminal connected at one end to a common junction point 32, the other end of resistor 28 being connected to the collector electrode 10*c* and the other end of resistor 30 being connected to the collector electrode 14*c*. A capacitor 33 is connected from the electrode 10*e* to the junction 32 for the purpose of filtering the power supply. The emitter electrode 14*e* is connected by means of conductor 34 and resistor 36 to the collector electrode 12*c*. An output terminal 38 is attached at the junction between the emitter electrode 14*e* and the one side of the resistor 36**.

Two groups of semiconductor diodes indicated generally by numerals 40 and 42, respectively, are connected through resistors 44 and 46 to a source of negative potential and to common junctions 48 and 50. The diodes in the groups 40 and 42 are poled to perform the AND logic function. In other words, in order to obtain a logical "1" condition (negative potential) at junction 48, all of the anode electrodes of the diodes in group 40 must be at the logical "1" level. Similarly, for a logical "1" signal to be present at junction 50, the anode electrodes of all of the diodes in group 42 must have a logical "1" input signal applied to it. A logical "0" signal applied to any one diode in each of the groups 40 and 42 will result in a logical "0" signal at junctions 48 and 50.

The output terminal 48 of AND circuit 40 is connected through a pair of diodes 52 and 54 to the base electrodes **10*b* and 12*b* of transistors 10 and 12, the cathode electrodes of the diodes 52 and 54 being directly connected to an output terminal 48 of AND gate 40. In a similar manner, the cathode electrodes of diodes 56 and 58 are connected in common at junction 50 which, in turn, is the output junction for the AND circuit 42. Diodes 52 through 58 have their anode electrodes connected directly to the base electrodes of transistors 10 and 12. The diodes 52 through 58 perform an OR logic function. In other words, if a binary "1" input signal (relatively negative) is applied at either terminal 48 or 50, or to both, a binary "1" signal will be applied to the base electrodes 10*b* and 12*b*. On the other hand, if a binary "0" (positive signal) is applied to both terminals 48 and 50, a binary "0" signal will be applied to the base electrodes 10*b* and 12*b*. As will be shown hereinbelow, the transistors 10 and 12** perform the logical NOT function. Hence, the complete function performed by the preferred embodiment is AND–OR–NOT.

Now that the configuration of the circuit of the preferred embodiment of the present invention has been described in detail, a description of the operation of the circuit will now be presented.

*Operation*

In operation if any one of the input diodes in each of the groups 40 and 42 has a binary "0" signal (a relatively positive voltage) applied thereto, the signal appearing at the junction 48 and 50 will also be relatively positive such that a positive signal will be applied to the base electrodes 10*b* and 12*b*. Because NPN transistors are employed as the inverting elements, this positive signal will result in the transistors 10 and 12 being heavily conductive. With transistor 10 being heavily conductive, the base electrode 14*b* will be negative due to the low impedance presented between the negative voltage source connected to the emitter electrode 10*e* and the collector electrode 10*c* to which the base electrode 14*b* is connected. The emitter follower transistor 14 will therefore be reversed biased and nonconducting. Hence, the output at terminal 38 will be at the logical "1" level (relatively negative) due to the low impedance presented between the emitter electrode 12*e* and the collector electrode 12*c* of transistor 12. With transistor 12 heavily conducting, a substantial current will flow to the load connected ot the output terminal 38 and where the load is another identical logic circuit having a substantial input capacity, the driving circuit serves as a current source for charging this capacity very rapidly.

If all of the input diodes in group 40 have a logical "1" signal applied thereto the output appearing at junction 48 will be also a logical "1" signal. This signal will pass through the diodes 52 and 54 causing the base electrodes 10*b* and 12*b* to be relatively negative. This, of course, reverse biases the transistors 10 and 12 thereby rendering them non-conductive. When transistor 10 is rendered non-conductive, the potential on conductor 26 rises towards ground potential due to the fact that the junction 32 is grounded. Hence, the emitter follower stage 14 will be rendered conductive and a low impedance will be presented between the emitter electrode 14*e* and the collector electrode 14*c*. Because the current limiting resistor 30 is of a small ohmic value, the output terminal 38 will approach the base to emitter drop $V_{be}$ of the transistor 14 indicative of a binary "0" condition. It is to be noted that when the transistor 14 is highly conductive, a substantially short circuited path is provided to the output terminal 38 which in a practical system is connected to the input diodes of a similar stage or to a standard Diode-Transistor Logic circuit. The charge present on any capacity type load may therefor be rapidly removed through the discharge path which includes conductor 34, the emitter to collector of transistor 14 and the resistor 30 to the grounded terminal 32.

Thus it can be seen that the circuit of the present invention serves as a current source for charging any capacitive loads when operating in a first mode and as a current sink for discharging the capacitive loads when operating in its other mode. Hence, extremely short rise and fall time characteristics can be achieved.

The extremely high speed switching capabilities of the circuit of the present invention will now be explained.

In general, in order to switch saturated inverter rapidly into an "on" condition, a large overdrive current should be supplied to the base of the transistor during the switch ing transient period. After the switching transient pulse terminates, the base current should be reduced to a value sufficient merely to hold the transistor in the "on" condition. Any excess current to the base at this time will increase the storage time of the transistor, making it more difficult to rapidly turn "off" the transistor at a later time. Similarly, during the turn "off" interval high overdrive current of a reverse polarity should be supplied to the base electrode of the transistor.

In the circuit of the present invention if, for example, transistors 10 and 12 are "off", diodes 56 and 58 will be conductive. The input diodes 42 do not conduct and are at logic "1" levels. If the input levels to any of the diodes in group 42 are dropped to logic "0", this diode starts conducting, thereby diverting current from diodes 56 and 58. However, it takes a predetermined time for the diodes 56 and 58 to recover to a nonconducting state. For a short time then, the diodes 56, 58 and 42 each conduct. High current is therefore supplied to the bases of transistors 10 and 12 assuring high speed switching to the "on" state.

If now a logical "1" signal is applied to the input diodes, OR diodes 56 and 58 again start conducting and the previously conducting diodes in group 42 recover which assures high current overdrive to the transistors 10 and 12 of reverse polarity for the period of recovery which serves to turn transistors 10 and 12 "off."

The resistor 30 is used in the circuit to decrease the collector to emitter voltage of transistor 14, thereby reducing the power dissipation in transistor 14. The resistor 30 also serves to protect the transistor 14 from damage in the event that the output terminal 38 is accidentally shorted to ground. In a similar fashion, the resistor 36 which is connected to the collector electrode of the transistor 12, serves to protect transistor 12 in the event that the output terminal 58 is short circuited. The resistor 36 tends to limit the current which would otherwise flow between the emitter and collector of transistor 12.

As was mentioned previously in the specification, the resistors 16 and 18 which are connected between the grounded terminal 20 and the base electrodes 10*b* and 12*b* are selected to provide equal base current to transistors 10 and 12. By using properly selected resistors, there is no need to precisely select matching transistors in terms of their base to emitter drop. Accordingly, the resistors 16 and 18 prevent "current hogging" by one of the two transistors 10 and 12.

For the purpose of illustration only, the following components and voltages values may be used in constructing the preferred embodiment of the invention. It is to be understood, however, that these component values are not critical and that other values may be used without departing from the scope of the present invention.

| | | |
|---|---|---|
| $V_1$ | volts | −3 |
| $V_2$ | do | −3 |
| $V_3$ | do | −12 |
| $V_4$ | do | −12 |
| $R_{16}$ | ohms | 910 |
| $R_{18}$ | do | 910 |
| $R_{28}$ | do | 51 |
| $R_{36}$ | do | 7.5 |
| $R_{30}$ | do | 5.1 |
| $R_{44}$ | do | 1,000 |
| $R_{46}$ | do | 1,000 |
| $C_{33}$ | microfads | 0.2 |
| Transistors **10–14** | | Type 2N834 |
| Diodes | | Type G.E. DHD599 |

It is apparent from the foregoing description that the present invention provides a novel logic driving circuit wherein extremely fast switching can be accomplished and where in the circuit can be used to drive a large plurality of other similar circuits without suffering pulse time degradation. While only a single species has been shown in detail, other modifications may be apparent to one skilled in the art.

What is claimed is:

1. A transistor logic circuit comprising in combination:

first, second and third NPN transistors each having emitter, collector and base electrodes;

means for connecting said emitter electrodes on said first and second transistors to a first source of negative potential;

first and second resistor means for respectively connecting the collector electrodes on said first and second transistors individually to the emitter and collector electrodes of said third transistor, said second resistor means including coupling means for coupling to a point of fixed potential;

an output terminal connected to the emitter electrode of said third transistor;

means for directly connecting the base electrode of said third transistor to the collector electrode of said second transistor;

third resistor means for connecting the base electrodes of said first and second transistors to said point of fixed potential;

a first pair of diodes having their cathode electrodes connected at a junction and their anode electrodes directly connected individually to the base electrodes of said first and second transistors; and a plurality of other diodes having their cathode electrodes connected in common to said junction and their anode electrodes adapted to receive binary valued input signals.

2. A transistor logic circuit comprising in combination:

first, second and third NPN transistors each having emitter, collector and base electrodes;

means for connecting said emitter electrodes of said first and second transistors to a first source of negative potential;

first and second resistor means for respectively connecting the collector electrodes on said first and second transistors individually to the emitter and collector electrodes of said third transistor, said second resistor means including coupling means for coupling to a point of fixed potential;

an output terminal connected to the emitter electrode of said third transistor;

means for directly connecting the base electrode of said third transistor to the collector electrode of said second transistor;

third resistor means for connecting the base electrodes of said first and second transistors to said point of fixed potential;

capacitor means having one terminal coupled to the emitter electrode of said second transistor and a second terminal for coupling to said point of fixed potential;

first and second pairs of diodes each pair having their cathode electrodes connected at a junction and their anode electrodes directly connected individually in common to the base electrodes of said first and second transistors; and pluralities of other diodes arranged in at least two groups, the diodes in each group having their cathode electrodes connected in common individually to the junctions between the cathode electrodes of said first and second pairs of diodes and their anode electrodes adapted to receive binary valued input signals.

3. A transistor logic circuit as in claim 1 and further including capacitor means having one terminal coupled to the emitter electrode of said second transistor and a second terminal for coupling to said point of fixed potential.

References Cited

UNITED STATES PATENTS

| | | | |
|---|---|---|---|
| 3,124,758 | 3/1964 | Bellamy et al. | 330—24 |
| 3,271,590 | 9/1966 | Sturman | 307—88.5 |
| 3,358,154 | 12/1967 | Hung | 307—88.5 |

OTHER REFERENCES

EPSCO Bulletin TDC–112 Power Amplifier, November 1958.

ARTHUR GAUSS, *Primary Examiner.*

B. P. DAVIS, *Assistant Examiner.*